United States Patent
Song et al.

(10) Patent No.: US 8,174,862 B2
(45) Date of Patent: May 8, 2012

(54) FUSE CIRCUIT AND REDUNDANCY CIRCUIT

(75) Inventors: Choung-Ki Song, Gyeonggi-do (KR); Han-Sub Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 403 days.

(21) Appl. No.: 12/492,973

(22) Filed: Jun. 26, 2009

(65) Prior Publication Data

US 2010/0290298 A1 Nov. 18, 2010

(30) Foreign Application Priority Data

May 13, 2009 (KR) .................. 10-2009-0041596

(51) Int. Cl.
*G11C 17/00* (2006.01)
(52) U.S. Cl. .................. 365/96; 365/200
(58) Field of Classification Search .......... 365/96, 365/200, 201, 94
See application file for complete search history.

(56) References Cited

U.S. PATENT DOCUMENTS

| | | | | |
|---|---|---|---|---|
| 5,140,554 A | * | 8/1992 | Schreck et al. | 365/201 |
| 2001/0052633 A1 | * | 12/2001 | Oikawa | 257/529 |
| 2003/0107929 A1 | * | 6/2003 | Takase | 365/200 |
| 2007/0183245 A1 | * | 8/2007 | Lee et al. | 365/225.7 |

FOREIGN PATENT DOCUMENTS

| | | |
|---|---|---|
| KR | 1020000043041 | 7/2000 |
| KR | 1020090007674 | 1/2009 |

OTHER PUBLICATIONS

Notice of Preliminary Rejection issued from Korean Intellectual Property Office on Nov. 23, 2010.

* cited by examiner

*Primary Examiner* — Vu Le
(74) *Attorney, Agent, or Firm* — IP & T Group LLP

(57) ABSTRACT

A fuse circuit or a redundancy circuit is capable of detecting a fuse with a crack. The fuse circuit includes a fuse block configured to drive an output node through a current path including a fuse in response to a fuse enable signal, and a voltage detection block configured to detect a voltage level of the output node based on a critical voltage adjusted according to a test mode signal, thereby generating a fuse condition signal.

11 Claims, 10 Drawing Sheets

FUSE CIRCUIT AND REDUNDANCY CIRCUIT

CROSS-REFERENCE TO RELATED APPLICATIONS

The present application claims priority of Korean Patent Application No. 10-2009-0041596, filed on May 13, 2009, the disclosure of which is incorporated herein by reference in its entirety.

BACKGROUND OF THE INVENTION

The present invention relates to semiconductor design technology, and more particularly, to a redundancy circuit and a fuse circuit, capable of performing various circuit operations using fuse(s).

In general, as a degree of integration of a semiconductor memory device such as a double data rate synchronous dynamic random access memory (DDR SDRAM) device is increasing rapidly, tens of millions of memory cells are being included in one semiconductor memory device. However, even if only one of the memory cells fails, the semiconductor memory device may not perform a desired operation. As technology of fabricating the semiconductor memory device develops, a comparatively small number of memory cells may fail. Accordingly, it is very ineffective to dispose the semiconductor memory device as a defective product due the failure of only few memory cells in the product yields. In order to counter such deficiencies, redundancy memory cells are further employed in the semiconductor memory device in addition to normal memory cells. Therefore, in case where normal memory cells fail, the failed normal memory cells are replaced with the redundancy memory cells. Hereinafter, a failing memory cell that should be replaced with a redundancy memory cell is referred to as 'a repaired memory cell'.

Herein, address information corresponding to the repaired memory cell is provided by a redundancy circuit. The redundancy circuit includes a plurality of fuses for programming the address information of the repaired memory cell. Thus, the redundancy circuit generates the address information that is programmed to the fuses, i.e., repair information, and the semiconductor memory device compares the repair information and address information that is inputted thereto in reading and writing operations, and performs an operation of accessing the redundancy memory cell instead of the repaired memory cell in case where the repaired memory cell is accessed.

For illustration purposes, a method for programming the fuses included in the redundancy circuit includes an electric cutting scheme or a laser cutting scheme. Herein, the electric cutting scheme burns out a fuse intended to be cut by applying an over current to the fuse intended to be cut and the laser cutting scheme burns out the fuse intended to be cut by blowing the fuse intended to be cut using a laser beam. In general, the laser cutting scheme is widely used than the electric cutting scheme since it is comparatively simpler than the electric cutting scheme.

Meanwhile, the fuses are generally used in the semiconductor memory device as well as in the above-described redundancy circuit. For instance, the fuses may be used to tune a voltage in a constant-voltage generating circuit sensitively operating with respect to processes and they may be used in circuits requiring fine control.

FIG. 1 illustrates a conventional fuse circuit.

Referring to FIG. 1, the fuse circuit includes a fuse block 110 and a voltage detection block 130.

The fuse block 110 includes a $0^{th}$ PMOS transistor P0, a fuse F and a $0^{th}$ NMOS transistor N0 that are serially connected between an external supply voltage (VDD) terminal and a ground voltage (VSS) terminal, wherein a fuse enable signal FSE is coupled to gates of the $0^{th}$ PMOS transistor P0 and the $0^{th}$ NMOS transistor N0. Herein, the fuse enable signal FSE transfers from a logic high to a logic low if a power-up operation of the semiconductor memory device is terminated and thus internal and external reset operations are terminated. An output node of the fuse block 110 is driven by a current flowing through a pull-up current path and a current flowing through a pull-down current path.

The voltage detection block 130 is to latch a logic level corresponding to whether the fuse F is cut or uncut, and includes a first NMOS transistor N1, a first PMOS transistor P1 and a second NMOS transistor N2. Herein, the first PMOS transistor P1 and the second NMOS transistor N2 are serially connected to each other between the VDD terminal and the VSS terminal and an output signal FSEB of the fuse block 110 is supplied to gates of the first PMOS transistor P1 and the second NMOS transistor N2. Furthermore, the first NMOS transistor N1 includes a source-drain path connected between the output node of the fuse block 110 and the VSS terminal and a gate receiving a fuse condition signal FSOP that is an output signal of the voltage detection block 130.

FIG. 2 illustrates a timing diagram for explaining an operational timing of the fuse circuit in FIG. 1.

Referring to FIGS. 1 and 2, the fuse enable signal FSE transfers from a logic high to a logic low after the internal and external reset operations are terminated, as described above.

The output signal FSEB of the fuse block 110 has different logic levels according to whether the fuse F is cut or uncut. That is, the output signal FSEB of the fuse block 110 has the logic high level in case where the fuse F is uncut and it maintains the logic low level in case where the fuse F is cut.

The fuse condition signal FSOP outputted from the voltage detection block 130 is an inverted signal of the signal FSEB outputted from the fuse block 110. In other words, the fuse condition signal FSOP becomes a logic high in case where the fuse F is cut and a logic low in case where the fuse F is uncut.

FIG. 3 illustrates a conventional redundancy circuit.

Referring to FIG. 3, the redundancy circuit includes a fuse block 310, an NMOS transistor block 330, a latch block 350, a precharge block 370 and a repair information output block 390.

The fuse block 310 is for programming address information corresponding to a repaired memory cell and includes $0^{th}$ to $15^{th}$ fuses F0, F1, ..., and F15.

The NMOS transistor block 330 includes $0^{th}$ to $15^{th}$ NMOS transistors N0, N1, ..., and N15 having a source-drain path connected between one of the $0^{th}$ to $15^{th}$ fuses F0, F1, ..., and F15 and the VSS terminal and a gate to receive one of address information INF_ADD<0:15>. Herein, the address information INF_ADD<0:15> is in signals obtained by decoding addresses provided from the external and enabled corresponding to a corresponding memory cell matrix. For illustration purposes, the memory cell matrix ("mat") means a group of memory cells among the plurality of memory cells, and the $0^{th}$ to $15^{th}$ address information INF_ADD<0:15> is activated for the memory cell mat that includes memory cells that the addresses provided externally are intended for access.

The latch block 350 latches a logic level of a node A that is driven according to the programmed $0^{th}$ to $15^{th}$ fuses F0, F1, ..., and F15 and the $0^{th}$ to $15^{th}$ address information INF_ADD<0:15>, and includes $0^{th}$ and $1^{st}$ inverters INV0 and INV1.

The precharge block 370 sets an initial logic level of the latch block 350. The precharge block 370 includes a $0^{th}$ PMOS transistor P0 having a source-drain path connected between the VDD terminal and the node A and a gate receives a signal WLEN transferring from a logic low to a logic high in an active operation.

The repair information output block 390 outputs a repair information signal INF_REN in response to an output signal of the latch block 350 and includes a second inverter INV2. The semiconductor memory device determines whether or not a memory cell accessed is the repaired memory cell in response to the repair information signal INF_REN.

FIG. 4 illustrates a timing diagram for explaining an operation of the conventional redundancy circuit in FIG. 3. For illustration purposes, let's assume that a ninth fuse F9 is cut, the third address information INF_ADD<3> is activated in response to a first active command ACT1 of the semiconductor memory device, and the ninth address information INF_ADD<9> is activated in response to a second active command ACT2.

Referring to FIG. 4, the node A is precharged to a logic high in response to the signal WLEN having a logic low level before the first active command ACT1 is inputted. After that, the signal WLEN transfers to a logic high in response to the first active command ACT1 and the third NMOS transistor N3 corresponding to the third address information INF_ADD<3> is turned on. Since the third fuse F3 is uncut, a current path is formed between the node A and the VSS terminal. Thus, the node A becomes a logic low and the repair information signal INF_REN becomes a logic low.

Then, the signal WLEN transfers to a logic high in response to the second active command ACT2 and the ninth NMOS transistor N9 corresponding to the ninth address information INF_ADD<9> is turned on. Since the ninth fuse F9 is cut, a current path is not formed between the node A and the VSS terminal and thus the node A maintains a logic high.

For illustration purposes, the repair information signal INF_REN having a logic high level or a logic low level means address information of the repaired memory cell.

As the semiconductor memory device is getting smaller and the degree of integration is increasing due to advancement of fabrication technology for semiconductor memory devices, accompanying parasitic capacitance is getting comparatively larger. However, since a space between lines or a space between circuits in the semiconductor memory device is being designed to be comparatively close in proportion to the increase of the integration, there occur various problems. One such a problem is a crack generated in a fuse by a fuse cutting operation.

FIG. 5 illustrates a view for explaining a crack generated in a fuse and shows a fuse intended to be cut B and other fuses A and C.

Referring to FIG. 5, the fuse B for being cut is cut through a blowing process. At this time, damage, e.g., a crack, occurs in the fuses A and C adjacent to the fuse B due to conductive by-products and an impact generated when performing the blowing process. Of course, the crack may be generated not only in the blowing process but also due to the stress between insulation layers covering fuses or a processing failure. FIG. 6 illustrates an image for showing fuses where cracks are generated.

The crack is generally classified into three types. A first one is a defective crack immediately leads to a failure of a fuse; a second one is a progressive crack, wherein a fuse having the progressive crack causes a failure according to the environment and the time; and a third one is a crack that does not cause a failure during a life of the semiconductor memory device since the crack is not serious. In the first case, since a malfunction occurs before the shipment of the semiconductor memory device and thus the crack is detected through a probe test and a package test, it is possible to repair or disuse the semiconductor memory device where the crack is generated. However, in the second case, since the crack is not detected in a test performed before the shipment of the semiconductor memory device and it causes a malfunction after the shipment of the semiconductor memory device, a user of the semiconductor memory device may be presented with a problem.

FIG. 7 illustrates a timing diagram for explaining a problem caused by a crack in the fuse F of the fuse circuit shown in FIG. 1. FIG. 7 shows the case where that the fuse F in FIG. 1 is not the fuse intended to be cut and the progressive crack is generated in the fuse F. As described in FIG. 2, in case where that the fuse F is not cut, i.e., the uncut case, the output signal FSEB of the fuse block 110 becomes a logic high and the fuse condition signal FSOP becomes a logic low. For illustration purposes, in case where the fuse F has a crack, the output signal FSEB of the fuse block 110 has a logic level that is lower than that of a normal state and becomes comparatively lower according to the environment and the time since then.

Referring to FIGS. 1 and 7, in a test performed before the shipment of the semiconductor memory device, a state of the fuse F that is not cut is reflected at the fuse condition signal FSOP and the output signal FSEB of the fuse block 110. That is, since the fuse F before the shipment has a crack but is not cut, the current flowing through a pull-up current path I_PU including the $0^{th}$ PMOS transistor P0 and the fuse F becomes greater than the current flowing through a pull-down current path I_PD including the first NMOS transistor N1, and thus the output node of the fuse block 110 has a logic high level, so that the fuse condition signal FSOP becomes a logic low. Accordingly, the semiconductor memory device operates in an intended normal condition that the fuse F is not cut.

However, after the shipment of the semiconductor memory device, the fuse F having the crack is getting deteriorated according to the environment and the time and thus falls into a condition where it seems to be cut. In the status of the fuse F changes to the condition where it seems to be cut, an amount of the current flowing through the pull-up current path I_PU is getting comparatively smaller, so that a voltage level of the output node of the fuse block 110 gradually decreases. After all, since the voltage level of the output node of the fuse block 110 becomes lower than a threshold voltage level Vth by the first PMOS transistor P1 and the second NMOS transistor N2, the output node of the fuse block 110 becomes a logic low and the fuse condition signal FSOP becomes a logic high. That is, the semiconductor memory device operates undesirable due to the fuse F having the crack. However, a conventional test may not detect the fuse F having the crack as defective. For illustration purposes, as can be seen from figures, the threshold voltage level Vth is an important factor determining a transfer point of the fuse condition signal FSOP.

FIG. 8 illustrates a circuit diagram for explaining a problem caused by a crack generated in the redundancy circuit in FIG. 3. It is assumed that that the crack is generated in the $10^{th}$ fuse F10. For illustration purposes, FIG. 8 shows a part of the circuit in FIG. 3 and uses the same reference numerals for the same components as those in FIG. 3. New reference numerals are used for a detailed circuit of the $0^{th}$ and $1^{th}$ inverters INV0 and INV1 constructing the latch block 350. Furthermore, FIG. 8 shows an example where the ninth fuse F9 in FIG. 3 is the intended fuse to be cut but a crack is generated in the $10^{th}$ fuse F10. That is, the $10^{th}$ fuse F10 is not a fuse intended to be cut and includes a progressive crack.

Herein, the $0^{th}$ inverter INV0 includes a first NMOS transistor N1 and a first PMOS transistor P1 connected in series between the VDD terminal and the VSS terminal. The first inverter INV1 includes a second and a third NMOS transistor N2 and N3 and a second and a third PMOS transistor P2 and P3 connected in series between the VDD terminal and the VSS terminal.

FIG. 9 illustrates a timing diagram for explaining a problem caused by the crack that is generated in the $10^{th}$ fuse F10 of the redundancy circuit in FIG. 8. For illustration purposes, in case where the $10^{th}$ fuse F10 is not cut, the node A has a signal with a waveform of a logic low in response to the $10^{th}$ address information INF_ADD<10> as in the case of using the third address information INF_ADD<3> as explained with respect to FIG. 4.

Referring to FIGS. 8 and 9, in a test before the shipment of the semiconductor memory device, the condition of the $10^{th}$ fuse F10 that is not cut is reflected at the node A. That is, since the $10^{th}$ fuse F10 is in the uncut condition in the test before the shipment, after the signal WLEN becomes a logic high, the current flowing through the pull-down current path I_PD including the $10^{th}$ fuse F10 and the $10^{th}$ NMOS transistor N10 becomes greater than the current flowing through the pull-up current path I_PU including the second and third PMOS transistors P2 and P3. Accordingly, the node A becomes a logic low and the repair information signal INF_REN becomes a logic low. In other words, the redundancy circuit operates in an intended normal condition that the $10^{th}$ fuse F10 is uncut.

However, after the shipment of the semiconductor memory device, the $10^{th}$ fuse F10 having the crack gets worse according to the environment and the time and thus falls into a condition where it seems to be cut. Since the condition of the $10^{th}$ fuse F10 changes to the condition where it seems to be cut, an amount of the current flowing through the pull-down current path I_PD is getting comparatively smaller than that of the current flowing through the pull-up current path I_PU, where the voltage level of the node A gradually increases. After all, since the voltage level of the node A becomes greater than a threshold voltage level Vth of the $0^{th}$ inverter INV0, the repair information signal INF_REN becomes a logic high. That is, the redundancy circuit is undesirably operated for the 10th fuse F10 having the crack and the repair information signal INF_REN generated thereby causes undesirable replacement of a normal memory cell with a redundancy memory cell.

As described above, a crack may be generated in a fuse by the cutting of a neighboring fuse, the processing failure, and the environment and the time, which causes undesirable operations in the typical fuse and redundancy circuits. It is preferable that the fuse where the crack is generated is detected before the shipment of the semiconductor memory device. However, since a fuse having a progressive crack that is not comparatively serious is not detected in the test before the shipment, the fuse may cause various undesirable operations after the shipment. As a result, a user may be presented with a problem and thus the reliability of a product may deteriorate.

SUMMARY OF THE INVENTION

An embodiment of the present invention is directed to providing a fuse circuit capable of adjusting a critical voltage that is a reference voltage to detect a condition of a fuse in a test.

Another embodiment of the present invention is directed to providing a redundancy circuit capable of detecting a fuse where a crack may be generated when generating a repair information signal.

Still another embodiment of the present invention is directed to providing a fuse circuit and a redundancy circuit, capable of detecting a fuse with a crack.

In accordance with an aspect of the present invention, there is provided a fuse circuit including: a fuse block configured to drive an output node through a current path including a fuse in response to a fuse enable signal; and a voltage detection block configured to detect a voltage level of the output node based on a critical voltage adjusted according to a test mode signal, thereby generating a fuse condition signal.

In accordance with another aspect of the present invention, there is provided a fuse circuit including: a fuse block configured to drive an output node through a current path including a fuse in response to a fuse enable signal; an output block configured to detect a voltage level of the output node, thereby generating a fuse condition signal; and an adjusting block configured to adjust a threshold voltage of the output block in response to a test mode signal.

In accordance with another aspect of the present invention, there is provided a redundancy circuit including: a fuse block configured to drive an output node through a current path including a selected fuse of a plurality of fuses in response to address information corresponding to a plurality of memory cells, wherein address information corresponding to a repaired memory cell among the plurality of memory cells is programmed into the plurality of fuses; and a voltage detection block configured to detect a voltage level of the output node based on a critical voltage adjusted according to a test mode signal, thereby generating a repair information signal.

In accordance with another aspect of the present invention, there is provided a redundancy circuit including: a fuse block configured to drive an output node through a current path including a selected fuse of a plurality of fuses in response to address information corresponding to a plurality of memory cells, wherein address information corresponding to a repaired memory cell among the plurality of memory cells is programmed into the plurality of fuses; an output block configured to detect a voltage level of the output node, thereby generating a repair information signal; and an adjusting block configured to adjust a threshold voltage of the output block in response to a test mode signal.

The present invention can detect a fuse including a crack by adjusting a critical voltage that is a reference voltage to detect a condition of a fuse in a test before the shipment. Since it is possible to repair the fuse where the crack is generated based on the detected results, undesirable operations of the semiconductor memory device by the crack of the fuse can be prevented.

DESCRIPTION OF SPECIFIC EMBODIMENTS

Other objects and advantages of the present invention can be understood by the following description, and become apparent with reference to the embodiments of the present invention.

Figure 10:
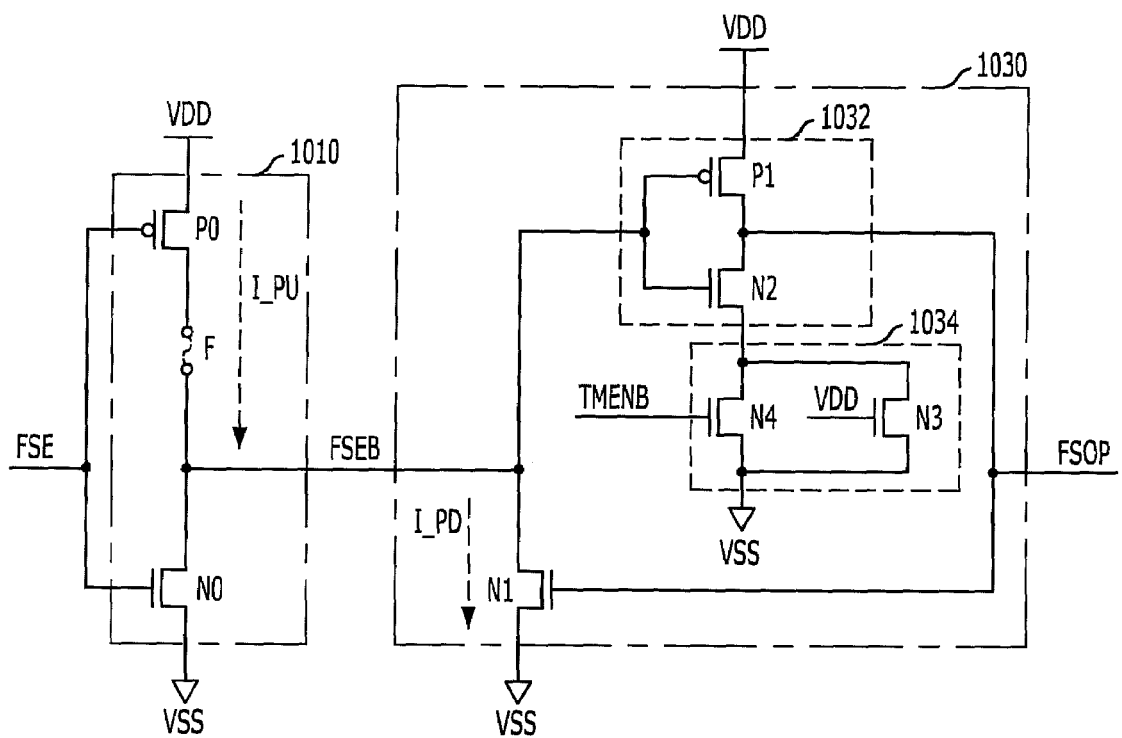
FIG. 10 illustrates a fuse circuit in accordance with an embodiment of the present invention.

FIG. 10 illustrates a fuse circuit in accordance with an embodiment of the present invention.

Referring to FIG. 10, the fuse circuit includes a fuse block 1010 and a voltage detection block 1030.

The fuse block 1010 includes a $0^{th}$ PMOS transistor P0, a fuse F and a $0^{th}$ NMOS transistor N0 that are connected in series between an external supply voltage (VDD) terminal and a ground voltage (VSS) terminal, wherein a fuse enable signal FSE is provided to gates of the $0^{th}$ PMOS transistor P0 and the $0^{th}$ NMOS transistor N0. Herein, the fuse enable signal FSE transfers from a logic high to a logic low if a power-up operation of a semiconductor memory device is terminated and thus internal and external reset operations are terminated. Thus, the fuse block 1010 can drive its output node through pull-up and pull-down current paths I_PU and I_PD including the fuse F in response to the fuse enable signal FSE. Herein, the output node of the fuse block 1010 means a node through which an output signal FSEB of the fuse block 1010 is outputted.

In this embodiment of the present invention, it is assumed that a crack is generated in the fuse F and the fuse F with such a status is indicated by a dotted line as shown in FIG. 10.

The voltage detection block 1030 latches the output signal FSEB of the fuse block 1010 corresponding to whether the fuse F is cut or uncut. Furthermore, the voltage detection block 1030 can generate a fuse condition signal FSOP by detecting the output signal FSEB of the fuse block 1010 on the basis of a critical voltage corresponding to a test mode signal TMENB. A first NMOS transistor N1 operates in response to the fuse condition signal FSOP fed back thereto to thereby make the voltage detection block 1030 perform the latching operation during a period where the fuse enable signal FSE has a logic high, and it can be used as the pull-down current path I_PD for the fuse F that is uncut during a period where the fuse enable signal FSE has a logic low. For illustration purposes, the critical voltage may be a threshold voltage of an output unit 1032.

The output unit 1032 included in the voltage detection block 1030 detects a voltage level of the output signal FSEB of the fuse block 1010 to output the fuse condition signal FSOP, and thus it includes a first PMOS transistor P1 and a second NMOS transistor N2. Herein, the first PMOS transistor P1 and the second NMOS transistor N2 are connected in series to each other between the VDD terminal and an adjusting unit 1034, and receive the output signal FSEB of the fuse block 1010 through their gates.

The adjusting unit 1034 adjusts a value of the threshold voltage of the output unit 1032 in response to the test mode signal TMENB. The adjusting unit 1034 includes a third NMOS transistor N3 receiving an external supply voltage (VDD) through its gate and a fourth NMOS transistor N4 receiving the test mode signal TMENB through its gate, which include a source-drain path connected between the output unit 1032 and the VSS terminal. Accordingly, the adjusting unit 1034 of the present invention can adjust a driving current flowing into the VSS terminal from the output unit 1032 in response to the test mode signal TMENB.

Figure 11:
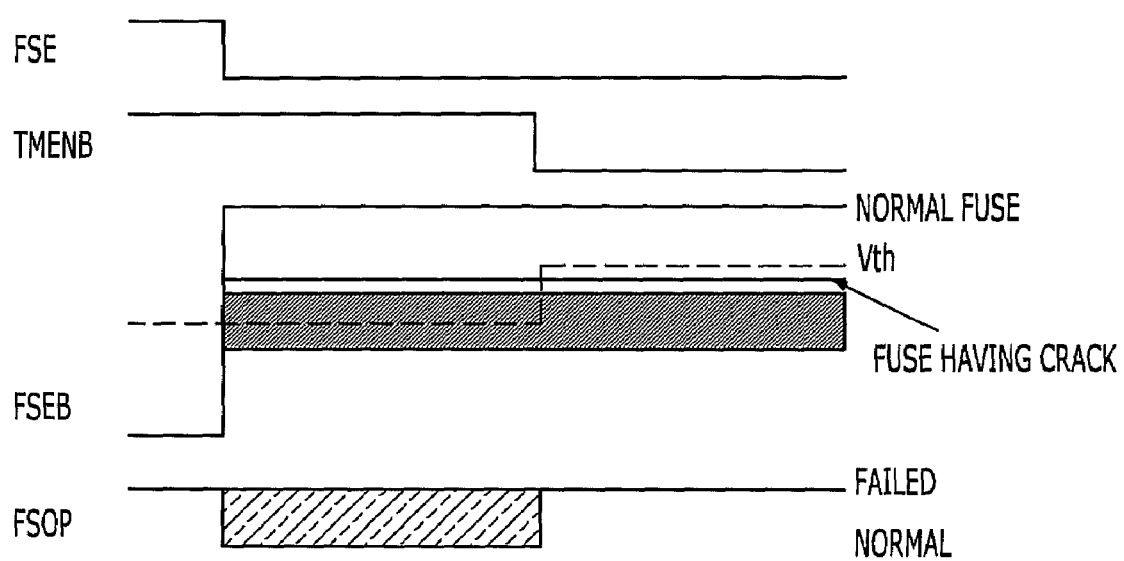
FIG. 11 illustrates a timing diagram for explaining an operational timing of the fuse circuit in FIG. 10.

FIG. 11 illustrates a timing diagram for explaining an operational timing of the fuse circuit in FIG. 10.

Referring to FIGS. 10 and 11, the fuse enable signal FSE transfers from a logic high to a logic low after the internal and external reset operations are terminated as described above.

First of all, in case where the fuse enable signal FSE is in a logic high in the state that the fourth NMOS transistor N4 is turned on in response to the test mode signal TMENB having a logic high level, the voltage detection block 1030 latches a logic low of the output signal FSEB of the fuse block 1010 to thereby output the fuse condition signal FSOP having a logic high level.

After then, if the fuse enable signal FSE transfers to a logic low, the output signal FSEB of the fuse block 1010 becomes a logic high. At this time, since the output signal FSEB of the fuse block 1010 has a voltage level that is sufficiently higher than that of the threshold voltage Vth of the output unit 1032 in case where of a normal fuse where a crack is not generated, there is no problem to detect a condition of a fuse that is uncut. Even, in case where of the fuse F where the crack is generated, since the fuse F is not cut, the output signal FSEB of the fuse block 1010 has a voltage level that is not sufficiently higher, but a little bit higher than that of the threshold voltage Vth of the output unit 1032. Therefore, the fuse condition signal FSOP may have a logic low level corresponding to the cut condition of the fuse F or a logic high level corresponding to the uncut condition of the fuse F. That is, it is difficult to detect the condition of the fuse F.

Thus, in this embodiment of the present invention, it is possible to move the threshold voltage Vth of the output unit 1032 to the supply voltage VDD by turning off the fourth NMOS transistor N4 using the test mode signal TMENB. That is, the fuse F having the crack that is not detected during a period where the test mode signal TMENB has a logic high level can be detected during a period where the test mode signal TMENB has a logic low level.

The fuse F where the crack is generated was not intended to be cut. Accordingly, the fuse condition signal FSOP becomes a logic low and thus the fuse F should be determined as a normal fuse. However, the fuse F where the crack is generated and the condition that goes undetected leads to undesirable operations. The fuse circuit in accordance with the embodiment of the present invention can detect a defective condition for the fuse F having the crack in response to the test mode signal TMENB. In other words, by raising a voltage level of the threshold voltage Vth of the output unit 1032 to a level higher than a voltage level of the output signal FSEB of the fuse block 1010 corresponding to the fuse F having the crack, it is possible to detect the fuse F where the crack is generated.

Figure 12:
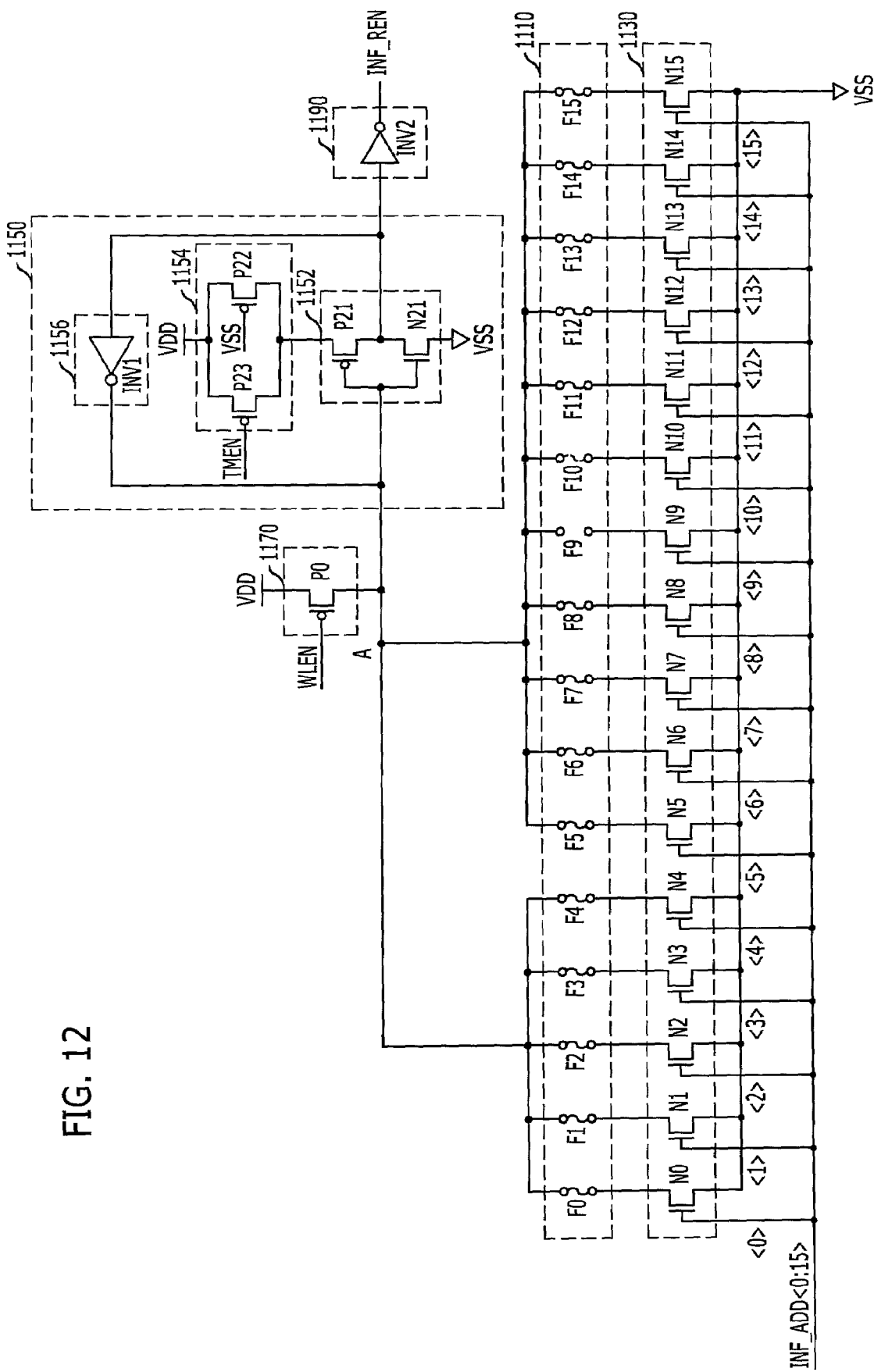
FIG. 12 illustrates a redundancy circuit in accordance with an embodiment of the present invention.

FIG. 12 illustrates a redundancy circuit in accordance with an embodiment of the present invention.

Referring to FIG. 12, the redundancy circuit includes a fuse block 1110, an NMOS transistor block 1130, a voltage detection block 1150, a precharge block 1170 and a repair information output block 1190.

The fuse block 1110 is for programming address information corresponding to a repaired memory cell and includes $0^{th}$ to $15^{th}$ fuses F0, F1, ..., and F15.

The NMOS transistor block 1130 includes $0^{th}$ to $15^{th}$ NMOS transistors N0, N1, ..., and N15 which include a source-drain path connected between one of the $0^{th}$ to $15^{th}$ fuses F0, F1, ..., and F15 and the VSS terminal and a gate receiving one of address information INF_ADD<0:15>. Herein, the address information INF_ADD<0:15> is obtained by decoding addresses provided from the external to enable a corresponding memory cell mat. The fuses F0, F1, ..., and F15 included in the fuse block 1110 are respectively connected to their corresponding NMOS transistors $0^{th}$ to $15^{th}$ transistors N0, N1, ..., and N15 included in the NMOS transistor block 1130, and they may form pull-down current paths in response to fuses that are not cut.

Figure 8:
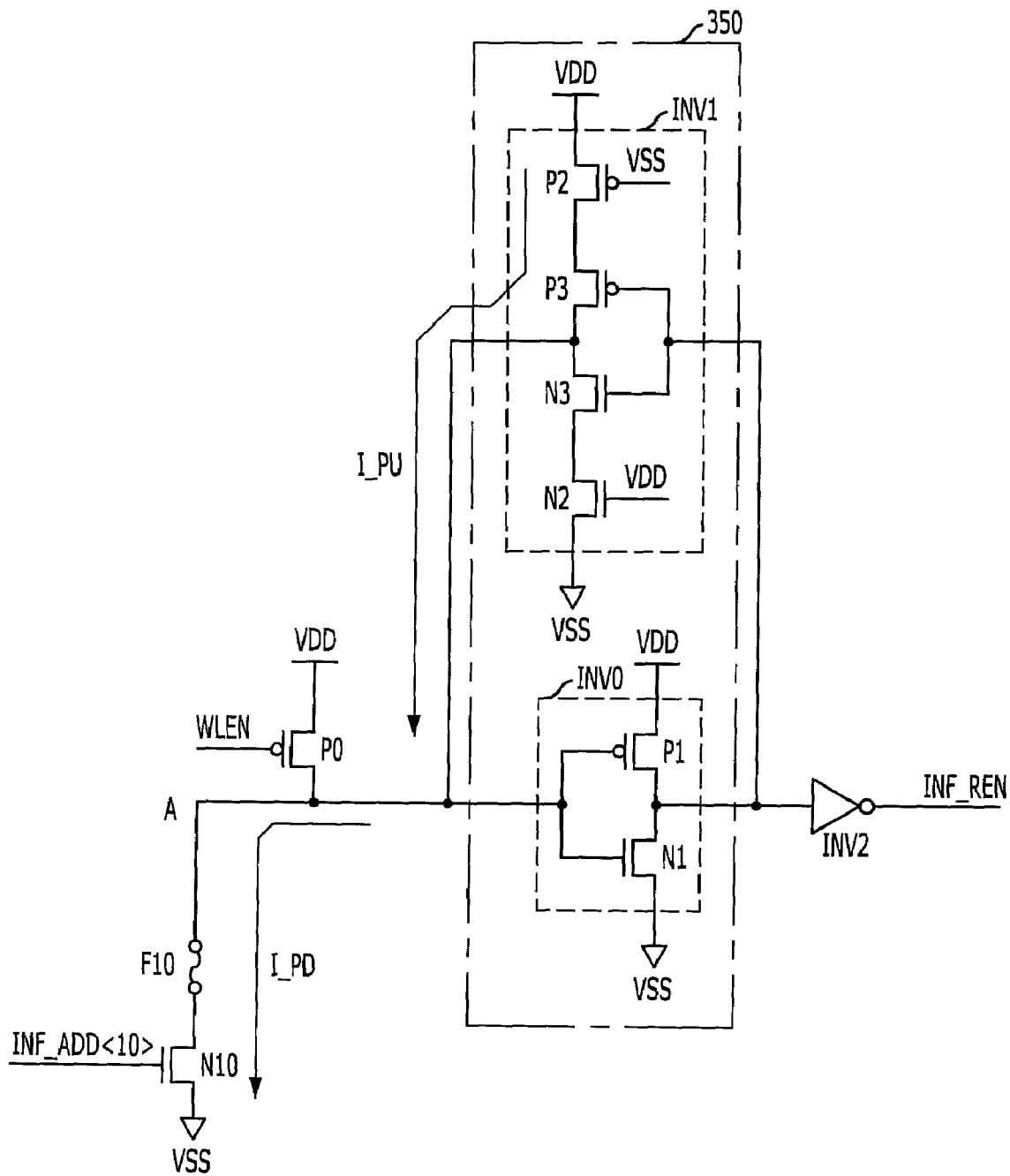
FIG. 8 illustrates a circuit diagram for explaining a problem caused by a crack generated in the redundancy circuit in FIG. 3.
Figure 9:
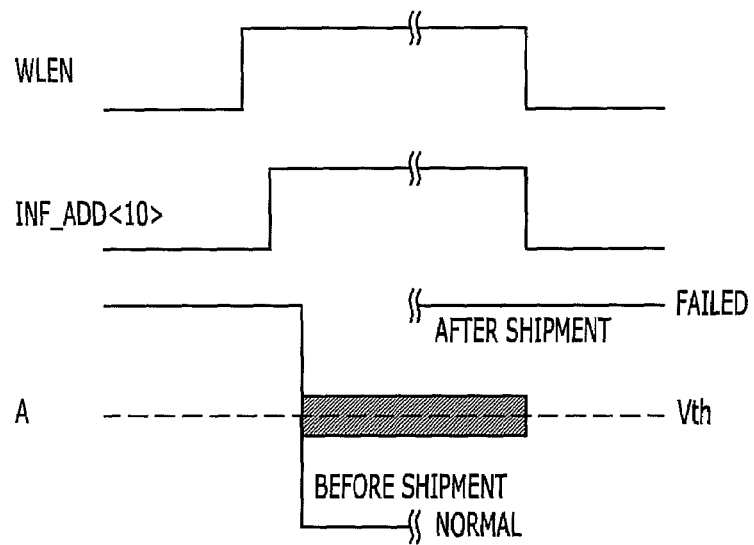
FIG. 9 illustrates a timing diagram for explaining a problem caused by the crack that is generated in the $10^{th}$ fuse F10 of the redundancy circuit in FIG. 8.

The voltage detection block 1150 latches a corresponding logic level in response to the $0^{th}$ to $15^{th}$ address information INF_ADD<0:15> and information programmed in the fuse block 1110, and includes an output unit 1152, an adjusting unit 1154 and a feedback unit 1156. Then, the voltage detection block 1150 adjusts a threshold voltage level of the output unit 1152 in response to the test mode signal TMEN and thus it is possible to detect a voltage level of a node A on the basis of the adjusted threshold voltage to thereby generate a repair information signal INF_REN. For illustration purposes, a first inverter INV1 included in the feedback unit 1156 operates by receiving an output signal of the voltage detection block 1150 to make the voltage detection block 1150 perform the latching operation during a period where a signal WLEN is in a logic low state and may be used as a pull-up current path I_PU, referring to FIG. 8, during a period where the signal WLEN is in a logic high state. FIG. 12 further includes the adjusting unit 1154 compared to FIG. 8.

Meanwhile, the output unit 1152 detects the voltage level of the node A to output the repair information signal INF_REN, and includes a first PMOS transistor P21 and a first NMOS transistor N21. Herein, the first PMOS transistor P21 and the first NMOS transistor N21 are serially connected to each other between the adjusting unit 1154 and the VSS terminal, and include gates connected to the node A.

The adjusting unit 1154 adjusts the threshold voltage level of the output unit 1152 in response to a test mode signal TMEN. The adjusting unit 1154 includes a second PMOS transistor P22 having a gate coupled to a ground voltage VSS and a third PMOS transistor P23 having a gate coupled to the test mode signal TMEN, each of which includes a source-drain path connected between the VDD terminal and the output unit 1152. Herein, the test mode signal TMEN may have a logic low level in a normal mode and a logic high level in a test mode.

The precharge block 1170 sets an initial logic level of the voltage detection block 1150. The precharge block 1170 includes a $0^{th}$ PMOS transistor P0 which includes a source-drain path connected between the VDD terminal and the node A and a gate coupled to the signal WLEN, wherein the signal WLEN transfers from a logic low to a logic high in an active operation.

The repair information output block 1190 outputs the repair information signal INF_REN by receiving the output signal of the voltage detection block 1150 and includes a second inverter INV2. The semiconductor memory device determines whether or not a corresponding memory cell is a repaired memory cell in response to the repair information signal INF_REN.

For illustration purposes, FIG. 12 shows an example where the ninth fuse F9 is intended to be cut but a crack is generated in the $10^{th}$ fuse F10. Herein, the $10^{th}$ fuse F10 where the crack is generated is indicated by a dotted line.

Figure 1:
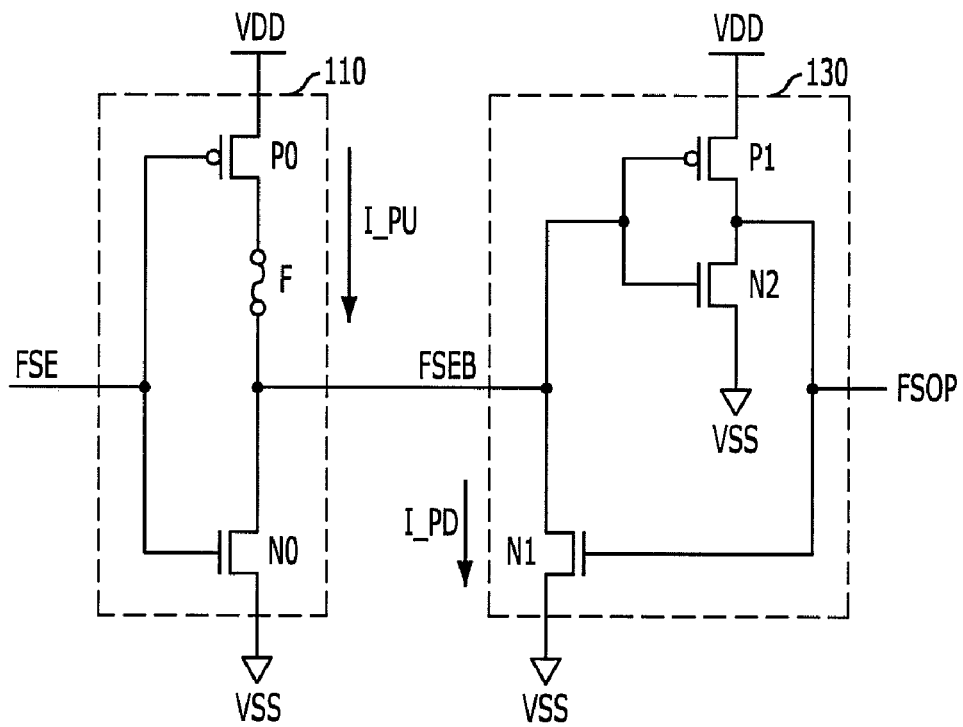
FIG. 1 illustrates a conventional fuse circuit.
Figure 2:
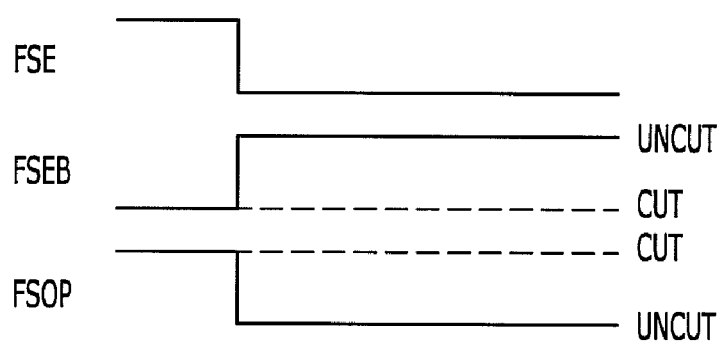
FIG. 2 illustrates a timing diagram for explaining an operational timing of the fuse circuit in FIG. 1.
Figure 3:
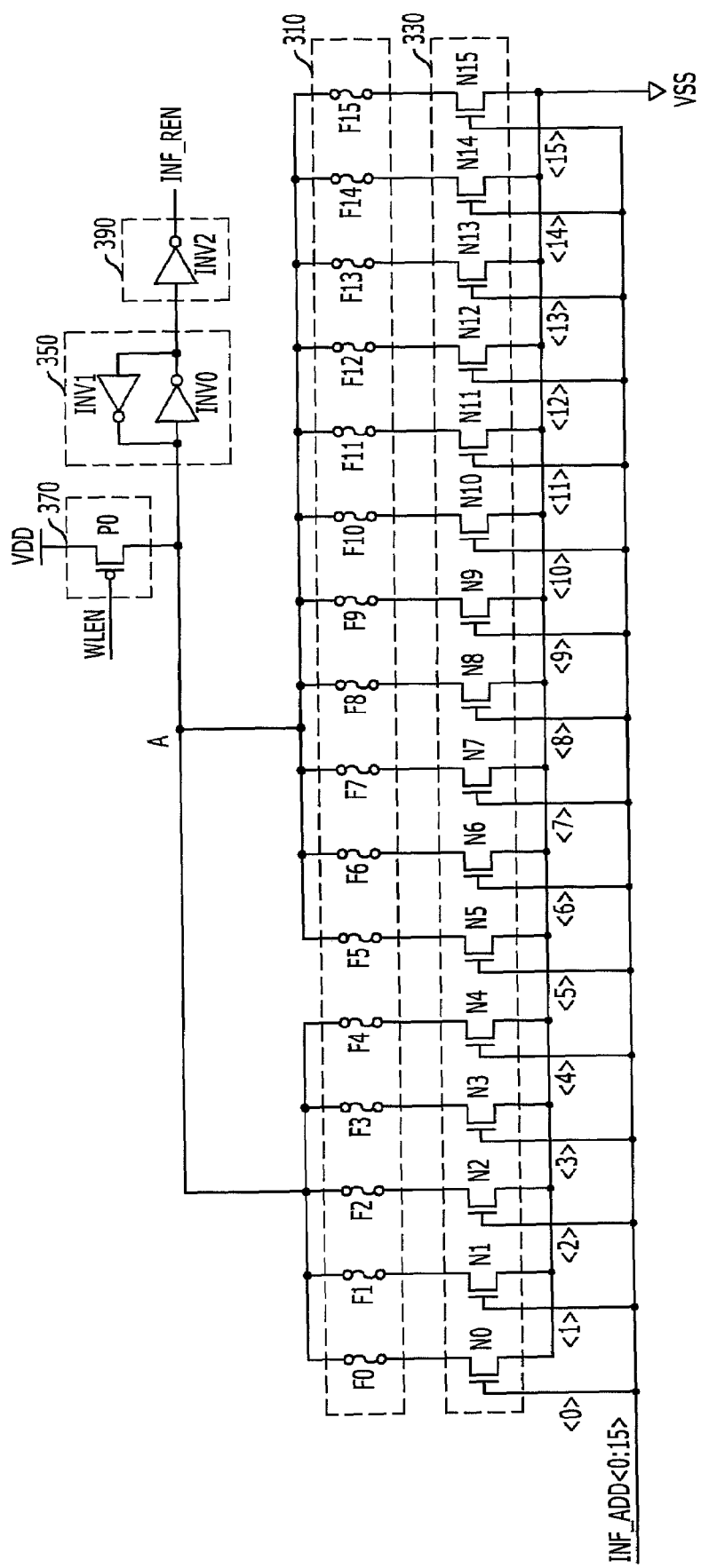
FIG. 3 illustrates a conventional redundancy circuit.
Figure 4:
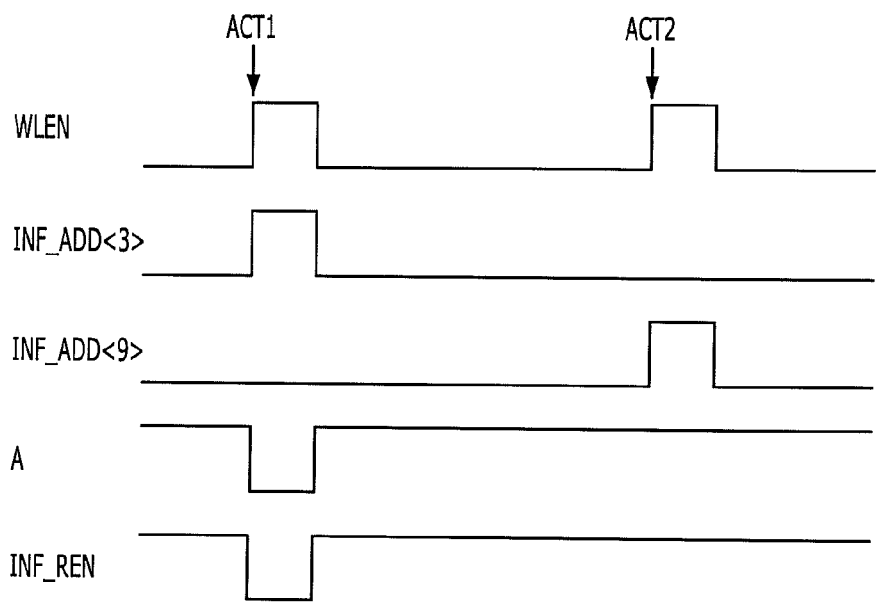
FIG. 4 illustrates a timing diagram for explaining an operation of the conventional redundancy circuit in FIG. 3.
Figure 5:
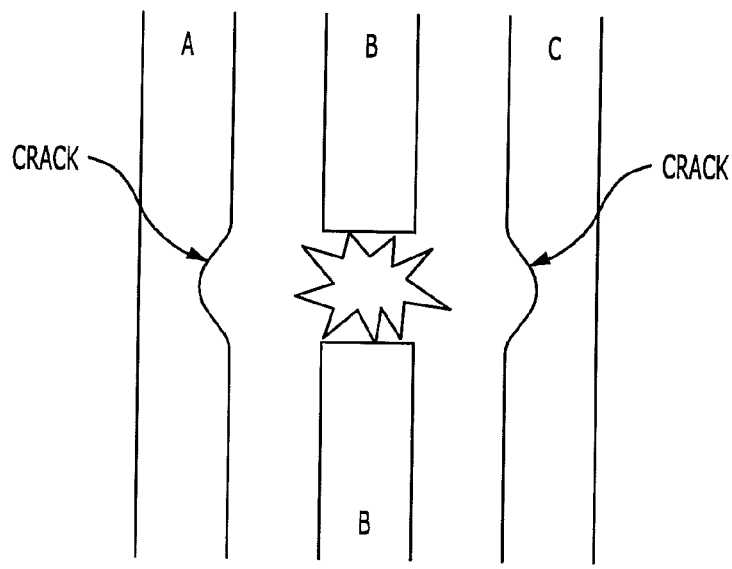
FIG. 5 illustrates a view for explaining a crack generated in a fuse.
Figure 6:
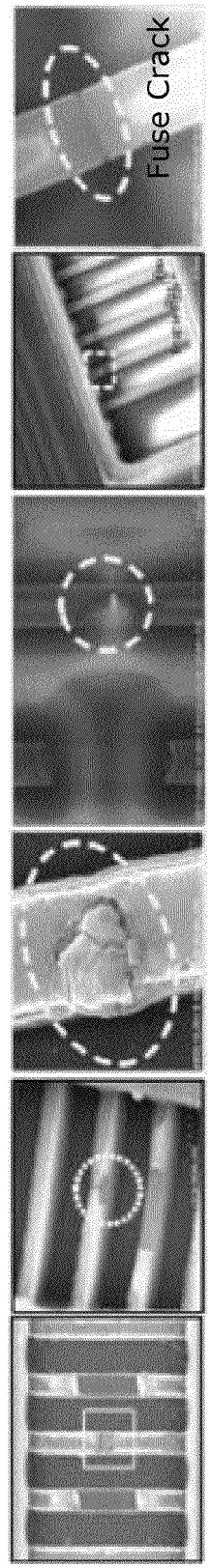
FIG. 6 illustrates an image for showing fuses where cracks are generated.
Figure 7:
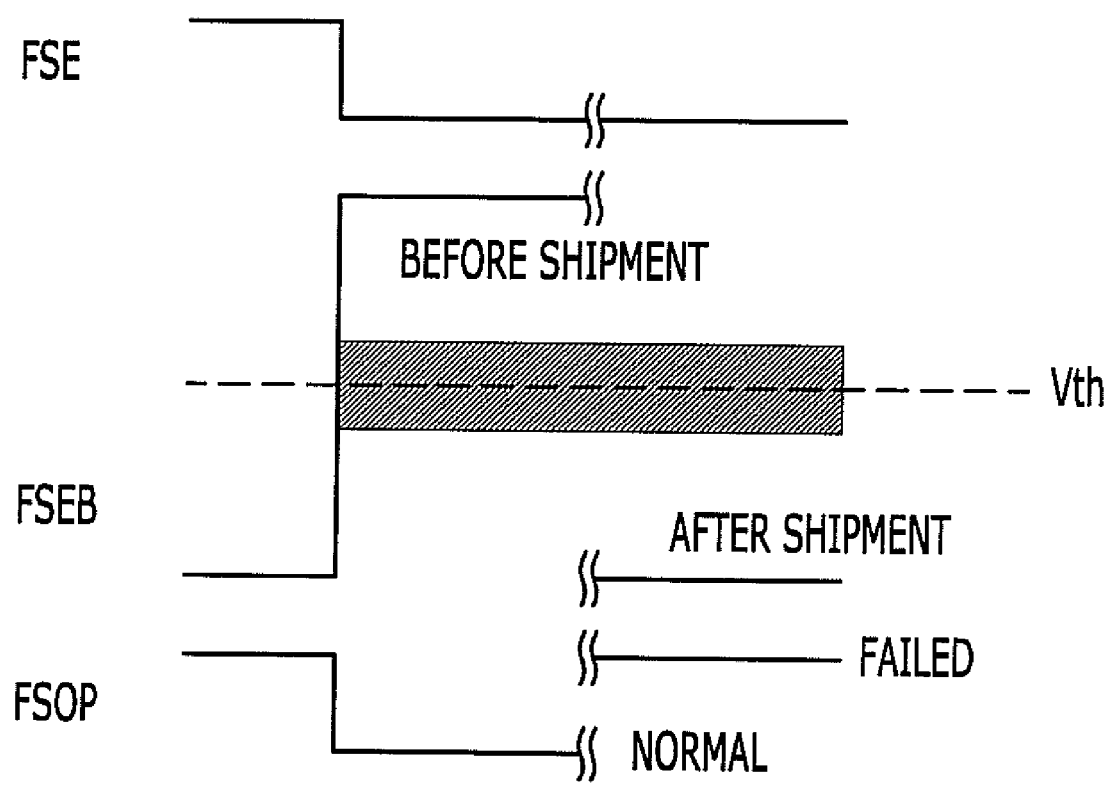
FIG. 7 illustrates a timing diagram for explaining a problem caused by the generation of a crack in a fuse F of the fuse circuit in FIG. 1.

First of all, if the ninth address information INF_ADD<9> is activated, since the ninth fuse F9 is cut, the node A maintains a logic high in response to the ninth address information INF_ADD<9> as shown in FIG. 4.

If the $10^{th}$ address information INF_ADD<10> is activated, since the $10^{th}$ fuse F10 should not be cut, the node A should have a logic low. However, the crack generated in the $10^{th}$ fuse F10 can make a current flowing through the pull-up current path I_PU to be greater than a current flowing through the pull-down current path I_PD based on the environment and the time, referring to FIG. 8. That is, since the voltage level of the node A is raised by the $10^{th}$ fuse F10 where the crack is generated, it makes the redundancy circuit perform undesirable operations where the $10^{th}$ fuse F10 seems to be cut.

Therefore, in this embodiment of the present invention, by adjusting a critical voltage of the voltage detection block 1150 in response to the test mode signal TMEN, it is possible to detect a voltage level of the node A even if it is comparatively smaller than that of the threshold voltage of the output unit 1152 used for detecting that a subject fuse is cut. In other words, by turning off the third PMOS transistor P23 in response to the test mode signal TMEN having a logic high state in the test mode, it is possible to move the threshold voltage of the output unit 1152 to trigger a switch of the output unit 1152 at voltages closer to the ground voltage VSS. That is, it is possible to detect the $10^{th}$ fuse F10 where the crack is generated during a period where the test mode signal TMEN has a logic high, wherein the $10^{th}$ fuse F10 is not detected to be cut during a period where the test mode signal TMEN has a logic low. After all, the present invention can detect the $10^{th}$ fuse F10 with the crack as being defective.

Figure 13:
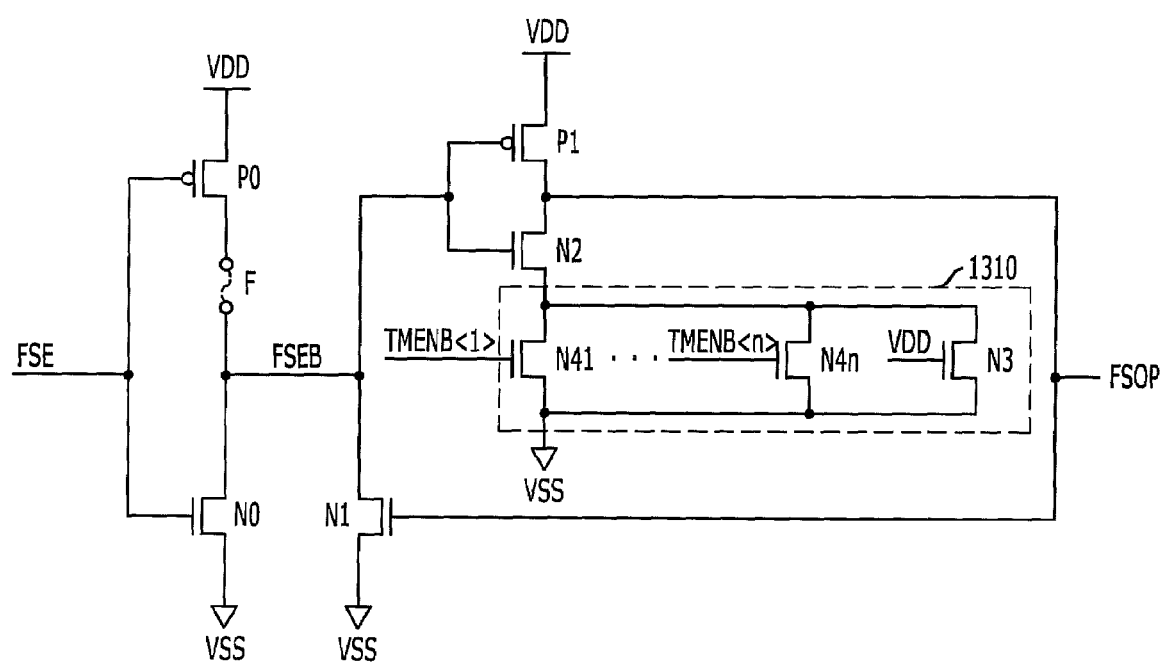
FIG. 13 illustrates a fuse circuit in accordance with another embodiment of the present invention.

FIG. 13 illustrates a fuse circuit in accordance with another embodiment of the present invention. In FIG. 13, the same reference numerals are used for the same components in FIG. 10. In FIG. 13, the fourth NMOS transistor N4 included in the adjusting unit 1034 in FIG. 10 is replaced with a plurality of NMOS transistors N41, N42, ..., and N4n that may receive a corresponding plurality of test mode signals TMENB<1>, TMENB<2>, ..., and TMENB<n>, respectively, wherein n is a natural number. Therefore, an adjusting unit 1310 in FIG. 13 including the plurality of NMOS transistors N41, N42, ..., and N4n can adjust a driving current flowing into the VSS terminal from the output unit 1032, referring to FIG. 10, in response to the plurality of test mode signals TMENB<1>, TMENB<2>, ..., and TMENB<n>. That is, in the construction described in FIG. 13, it is possible to much more finely adjust the voltage level of the threshold voltage corresponding to the second NMOS transistor N2 and the first PMOS transistor P1 according to the plurality of test mode signals TMENB<1>, TMENB<2>, ..., and TMENB<n>. When using such a configuration in a test, it is possible to even detect the extent of the crack generated in the fuse F.

As described above, since the present invention can detect a fuse including a crack that is small in its extent as well as a fuse status where a crack is significantly large, it is possible to enhance the reliability of the circuit operation of the semiconductor memory device. Furthermore, in case of the redundancy circuit, it is possible to guarantee the stable repair operation of the semiconductor memory device by generating the correct repair information signal by preventing undesirable operations due to the crack of the fuse.

While the present invention has been described with respect to the specific embodiments, it will be apparent to those skilled in the art that various changes and modifications may be made without departing from the spirit and scope of the invention as defined in the following claims.

Moreover, although the embodiment described in FIG. 10 illustrates the case where the adjusting unit 1034 is disposed between the output unit 1032 and the VSS terminal, the adjusting unit 1034 may be disposed between the VDD terminal and the output unit 1032 and thus a signal controlling the adjusting unit 1034 should be changed. Then, the change of the circuit may be applied to the circuits in FIGS. 12 and 13.

In addition, in the above embodiments, the illustrated logic gates and transistors may be implemented to have different locations and types according to polarities of signals inputted thereto.

What is claimed is:

1. A fuse circuit, comprising:
   a fuse block configured to drive an output node through a current path including a fuse in response to a fuse enable signal;
   an output block configured to detect a voltage level of the output node, thereby generating a fuse condition signal; and
   an adjusting block connected between a supply voltage terminal and the output block and configured to adjust a driving current flowing through the supply voltage terminal and the output block in response to a test mode signal.

2. The fuse circuit of claim 1, further comprising a feedback block configured to receive the fuse condition signal to make the output block perform a latching operation.

3. The fuse circuit of claim 1, wherein the adjusting block is configured to adjust the driving current in response to a plurality of test mode signals.

4. The fuse circuit of claim 1, wherein a threshold voltage of the output block is adjusted according to the driving current.

5. A redundancy circuit, comprising:
   a fuse block configured to drive an output node through a current path including a selected fuse of a plurality of fuses in response to address information corresponding to a plurality of memory cells, wherein address information corresponding to a repaired memory cell among the plurality of memory cells is programmed into the plurality of fuses;
   an output block configured to detect a voltage level of the output node, thereby generating a repair information signal; and
   an adjusting block connected between a supply voltage terminal and the output block and configured to adjust a driving current flowing through the supply voltage and the output block in response to a test mode signal.

6. The redundancy circuit of claim 5, further comprising a feedback block configured to receive the repair information signal to make the output block perform a latching operation.

7. The redundancy circuit of claim 5, further comprising a precharge block configured to precharge the output node in response to an active operation.

8. The redundancy circuit of claim 5, wherein the adjusting block is configured to adjust the driving current in response to a plurality of test mode signals.

9. The redundancy circuit of claim 5, wherein a threshold voltage of the output block is adjusted according to the driving current.

10. The redundancy circuit of claim 9, wherein the adjusting block is configured to reduce the threshold voltage in response to the test mode signal.

11. The redundancy circuit of claim 5, wherein the adjusting block includes a plurality of transistors connected in parallel between a power supply voltage and the output block and a transistor of the transistors is configured to be turned on or off in response to the test mode signal.

* * * * *